United States Patent [19]

Fukuzawa et al.

[11] Patent Number: 4,933,728

[45] Date of Patent: Jun. 12, 1990

[54] SEMICONDUCTOR OPTICAL DEVICE

[75] Inventors: Tadashi Fukuzawa, Setagaya; Eizaburo Yamada, Tama; Kenji Hiruma, Koganei; Hiroyoshi Matsumura, Iruma, all of Japan

[73] Assignee: Hitachi, Ltd., Tokyo, Japan

[21] Appl. No.: 309,929

[22] Filed: Feb. 13, 1989

Related U.S. Application Data

[63] Continuation of Ser. No. 2,669, filed as PCT JP86/00051 on Feb. 7, 1986, published as WO86/05925 on Oct. 9, 1986, abandoned.

[30] Foreign Application Priority Data

Mar. 25, 1985 [JP] Japan .................................. 60-58397
Feb. 7, 1986 [WO] PCT Int'l App. .. PCT/JP86/00051

[51] Int. Cl.$^5$ .................. H01L 29/161; H01L 27/12; H01L 33/00
[52] U.S. Cl. ........................................ 357/16; 357/4; 357/6; 357/17; 357/30; 372/45
[58] Field of Search ............... 357/4, 16, 17, 30 E, 357/30 F, 30 Q, 6; 372/45

[56] References Cited

U.S. PATENT DOCUMENTS

| | | | |
|---|---|---|---|
| 3,938,172 | 2/1976 | Lockwood | 372/45 |
| 4,045,749 | 8/1977 | Burnham et al. | 372/45 |
| 4,184,170 | 1/1980 | Burnham et al. | 357/16 |
| 4,195,305 | 3/1980 | Moon | 357/88 |
| 4,438,446 | 3/1984 | Tsang | 357/16 |
| 4,496,788 | 1/1985 | Hamakawa et al. | 357/16 |
| 4,578,127 | 3/1986 | Gossard et al. | 357/16 |
| 4,626,792 | 12/1986 | Liboff et al. | 372/41 |
| 4,633,279 | 12/1986 | Hipwood | 357/16 |
| 4,671,830 | 6/1987 | Burnham | 357/16 |
| 4,672,413 | 6/1987 | Gardner | 357/16 |
| 4,679,063 | 7/1987 | White | 357/16 |
| 4,682,196 | 7/1987 | Sakai et al. | 357/16 |
| 4,817,102 | 3/1989 | Maurer et al. | 372/45 |

FOREIGN PATENT DOCUMENTS

| | | | |
|---|---|---|---|
| 3345214 | 6/1985 | Fed. Rep. of Germany | 357/16 |
| 54-146984 | 11/1979 | Japan | 357/16 |
| 55-34445 | 3/1980 | Japan | 357/16 |

Primary Examiner—Andrew J. James
Assistant Examiner—Ngan Van Ngo
Attorney, Agent, or Firm—Antonelli, Terry, Stout & Kraus

[57] ABSTRACT

A semiconductor optical device in which a heterostructure is constructed by sandwiching a semiconductor layer including a thin film made of a semiconductor or insulator between semiconductors having a larger band gap than that of the thin film so that the electron-hole pairs generated through the thin film may recombine by the tunnel effect to emit an optical beam. The optical device is equipped with electrodes for controlling the probability of said recombination.

51 Claims, 4 Drawing Sheets

SEMICONDUCTOR OPTICAL DEVICE

This application is a continuation of application Ser. No. 002,669, filed as PCT JP86/00051 on Feb. 7, 1986, published as WO86/05925 on Oct. 9, 1986, now abandoned.

DESCRIPTION

1. Technical Field

The present invention relates to a semiconductor optical device capable of emitting an optical beam which is coherent in its wavelength and phase.

2. Background Art

Figure 1:
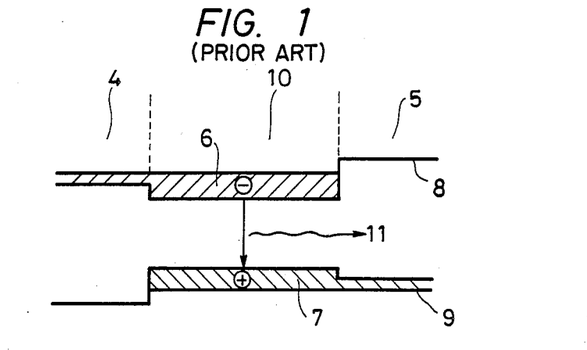
FIG. 1 is an energy band diagram showing the semiconductor laser by the prior art.

FIG. 1 shows an energy band diagram in the case where a forward bias is applied to a double heterostructure (constructed of a laser active layer 10, an n-type cladding layer 4 and a p-type cladding layer 5), which is used in a semiconductor laser of the prior art. Electrons 6 injected from the cladding layer 4 and positive holes 7 injected from the cladding layer 5 recombine in the active region 10 to emit an optical beam 11. In this scheme, the electrons and the positive holes are Fermi particles, and the carrier distribution in the band is determined in dependence upon the density of states and the Fermi distribution. In the band structure diagram, incidentally, reference numeral 8 denotes the bottom of the conduction band, and numeral 9 denotes the upper end of the valence electron band. If this distribution extends, the laser threshold current increases. If the active layer of the laser is assumed to have a quantum well structure, the density of state is changed from a parabolic function to a step function to establish a quantum level. As a result, the quantum size effect reduces the width of emission spectra to about $\frac{1}{2}$ to $\frac{1}{3}$. In this case, however, the carriers are the Fermi particles. Therefore the individual electrons and positive holes are absolutely independent, phases of each wave function are different, and they do not make coherent movement. In case a signal is to be transmitted through a laser beam, therefore, the overall average value of many carriers has to be changed.

DISCLOSURE OF INVENTION

An object of the present invention is to provide a semiconductor optical device capable of emitting an optical beam which is coherent in its phase and wavelength.

In the present invention, a spatially separated electron-hole pair being a Bose particle, Bose condensation is effected by increasing the density of the electrons and the positive holes while being cooled, thus establishing a scheme which is completely coherent in its phase. The emission from this scheme is remarkably coherent in both its phase and wavelength.

Figure 2:
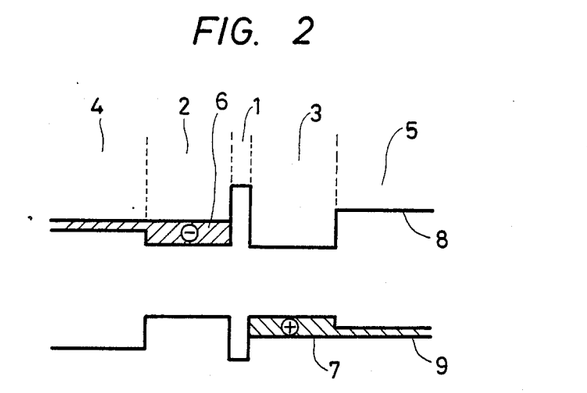
FIG. 2 is an energy band diagram showing a spatially separated electron-hole pair type semiconductor laser according to the present invention.

FIG. 2 is an energy band diagram of a semiconductor laser which is necessary for effecting the Bose condensation. The changes of a conduction band 8 and a valence electron band 9 in the direction of thickness are shown in the state wherein the bias voltage is applied in the forward direction. Semiconductor layers 2 and 3 appearing in FIG. 2 are laser active layers which have smaller band gaps than semiconductor layers 4 and 5. The type of conductivity can be exemplified by the following cases: (1) both the semiconductor layers 2 and 3 are undoped; (2) only one of the semiconductor layers 2 and 3 is undoped whereas the other has the same type of conductivity as that of the cladding layer 4 or 5 contacting therewith; and (3) the semiconductor layers 2 and 4 and the semiconductor layers 3 and 5 are respectively of the same type of conductivity.

In FIG. 2, incidentally, reference numeral 4 denotes an n-type cladding layer, and numeral 5 denotes a p-type cladding layer.

The difference from the semiconductor layer by the prior art resides in that there is formed in the laser active layer a barrier layer 1 for spatially separating the electrons 6 and the positive holes 7.

The process of effecting the Bose condensation in that scheme will be described in the following. The theoretical investigations of the conditions for the electrons and the positive holes opposed through the barrier layer to effect the Bose condensation have been made in 1975 by Yu. E. Lozovik et al. (as is disclosed in Soviet Physics (JETP. Lett.), vol. 22, pp. 274, 1975).

Figure 3:
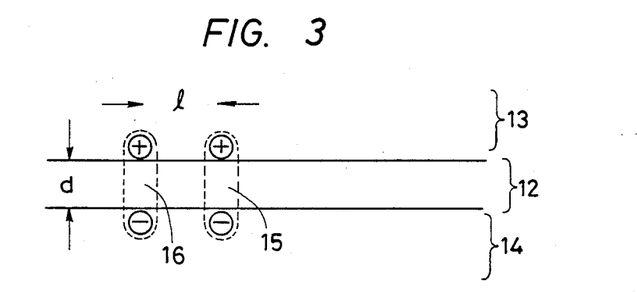
FIG. 3 is a diagram for explaining that the Bose condensation is caused in the case where the electrons and the positive holes are excited through a barrier.

The electrons and the positive holes (which are present in layers 13 and 14 of superconductive thin films) opposed through a barrier layer 12, as shown in FIG. 3, are turned into a kind of excitons 15 and 16 migrating in the plane of the layer 12 while attracting each other by the Coulomb force, in the case where the thickness d of the layer 12 is small. Those excitons are subjected to the Bose condensation because they are the Bose particles, if they are kept at a low temperature to have their density increased. According to the estimations by Lozovik et al., if the distance between the excitons is designated as l, the probability of recombination of the carriers due to the tunnel effect is about $1 \times 10^{-26}$ and can be neglected in fact, if the thickness d of the barrier and the distance l are about 100 Å, and the temperature for the condensation is about 100° K.

Incidentally, since what has been intended by them is to realize the superconduction in the scheme of the Bose condensation, the thickness of the barrier layer is so chosen that the electrons and the positive holes may not recombine by the tunnel effect. This point is essentially different from that of the present invention. More specifically, the present invention is similar in the fundamental process of the Bose condensation to the aforementioned theory of Lozovik et al., but is different from the scheme of Lozovik et al. in that the thickness d of the barrier layer is made small to promote the radiative recombination process between the electrons and the positive holes by choosing an optimum tunneling probability.

Since only the superconduction is the object of the Lozovik's scheme, the electron-hole recombination process by the tunnel effect is an unnecessary process which reduces the number of electron-hole pairs, and therefore the recombination must be prevented by using a 100 Å thick barrier layer in the case of Lozovik. If the barrier layer has its potential barrier height made excessively small or its thickness made excessively small, on the other hand, the electrons and the positive holes are caused to recombine one after another by the tunnel effect so that the concentration of the electron-hole pairs cannot be sufficient for establishing the Bose condensation. The main object of the present invention is to sequentially establish the Bose condensation and the recombination-emission process of the excitons by optimizing the thickness of that barrier layer. In FIG. 2, those of the electrons 6 injected into the active layer 2 and the positive holes 7 injected into the active layer 3, which are present near the barrier layer 1, are caused to attract each other to become excitons by the Coulomb force. If the Bose condensation is effected by the cooling treatment at a low temperature, the electrons and the positive holes near the barrier successively resulting in pairs so that the emissions obtained from the excitons have a high density and a coherent phase.

The gist of the present invention will be summarized in the following.

1. A semiconductor optical device is characterized: by having a hetero-structure which is constructed of first and second semiconductor layers opposed to each other through a thin film (which will become a barrier layer) of a semiconductor or insulator and having a smaller forbidden band energy gap than that of said thin film; by making said hetero-structure such that optical emissions by recombination are based mainly on the recombinations by tunneling between electrons and positive holes contained in the same one of said semiconductor layers; and by having means for controlling the probability of said tunneling recombination process by applying an electric field from the outside.

The aforementioned tunneling recombination emissions are caused by the recombinations of the excitons which are made of the electrons and the positive holes by the Coulomb force.

When said semiconductor optical device is cooled at a temperature not higher than 150° K., moreover, the aforementioned recombination emissions are due to the super-radiance from the excitons having been subjected to the Bose condensation.

We have also found that the super-radiance is established by making the barrier layer such that the tunneling probability T falls within a range of 0.6 to $1 \times 10^{-10}$ in the case where the relationship among the tunneling probability and the thickness D (Å) and the height H (eV) of the barrier layer satisfies the following Equation:

$$T = \exp[-0.4 D\sqrt{H}].$$

Moreover, we have found that, in the case where the excitons are dissociated by the electric field, the electrons and the positive holes are not sufficiently separated by the electric field when the thickness of the barrier is not less than 150 Å or sufficiently 100 Å, so that they combine without the tunneling recombination to provide none of the effects of the present invention.

Still moreover, we have found it preferable to make the overlap of the wave functions of the electrons and the positive holes through said thin layer larger than the overlap of the wave functions of the electrons and the positive holes in the same one of said semiconductor layers by making the thicknesses of said first and second semiconductor layers not smaller than 200 Å (or preferably 400 Å) thereby to push said electrons and said positive holes to the opposite sides of their respective ones of said semiconductor layers by the composition of crystal or a doped impurity in the crystal or a pseudo-potential established by the two and/or an external field.

Furthermore, the following modes of embodiment of the invention are also preferable:

A semiconductor optical device characterized by having means for applying an electric field in a direction normal to said thin film to said semiconductor layers opposed to each other through said thin film to collect said electrons at one of the interfaces between said thin film and said semiconductor layers and said positive holes at the other interface;

A semiconductor optical device characterized in that the composition and/or impurity density of one or both of said first and second semiconductor layers are made uneven in the direction of the thickness of said thin film to collect said electrons and said positive holes in the vicinity of said thin film;

A semiconductor optical device characterized in that a layered structure constructed of at least said thin film and said first and second semiconductor layers is sandwiched between third and fourth semiconductor layers which have larger forbidden band energy gaps than said first and second semiconductor layers and which have different types of conductivity;

A semiconductor optical device characterized in that said thin film is made of $Ga_{1-x}Al_xAs$, said first semiconductor layer is made of $Ga_{1-y}Al_yAs$, and said second semiconductor layer is made of $Ga_{1-z}Al_zAs$, wherein: $x > y$ and $z$; $1 \geq x > 0.1$; and $0.4 > y$ and $z \geq 0$; and A semiconductor optical device characterized in that said thin film is made of $Ga_xIn_{1-x}P_yAs_{1-y}$ (which holds even for $x=0$ and $y=0$), and said first and second semiconductor layers are made of $Ga_mIn_{1-m}P_xAs_{1-x}$.

BEST MODE FOR CARRYING OUT THE INVENTION

EXAMPLE 1

Figure 4:
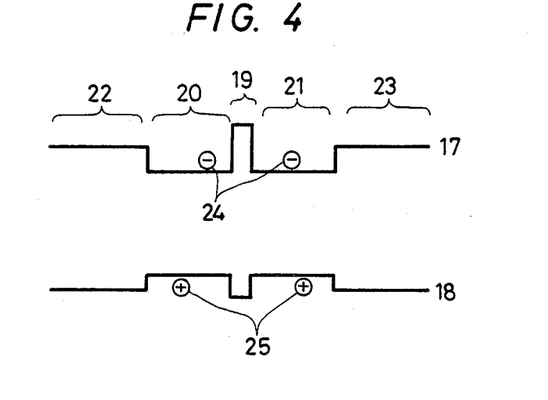
FIGS. 4 and 5 are diagrams explaining the principle of operation of a semiconductor optical device according to an embodiment of the present invention.
Figure 9:
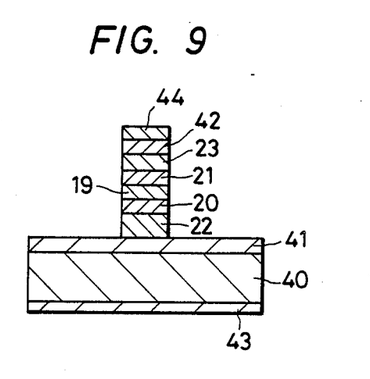

FIG. 4 schematically shows the changes in the direction of thickness of the band gaps of the bottom 17 of the conduction band and the upper end 18 of the valance electron band of the device according to the embodiment of the present invention. FIG. 9 is a section taken normal to the optical beam which is emitted from the semiconductor optical device of the present example. This state is realized by the following method. On an n-type GaAs substrate 40, there were caused to grow sequentially by the use of the molecular beam expitaxial method 0.5 microns of an n-type GaAs buffer layer 41, followed by an undoped $Ga_{0.7}Al_{0.3}As$ cladding layer 22 (2 microns), an undoped GaAs layer 20 (0.1 micron), an undoped $Ga_{0.5}Al_{0.5}As$ barrier layer 19 (which has a thickness of 20 Å), an undoped GaAs layer 21 (0.1 micron), an undoped $Ga_{0.7}Al_{0.3}As$ cladding layer 23 (2 microns), and a p-type GaAs layer 42 (0.2 microns) as a cap layer.

An n-side electrode 43 was formed after the back of the n-type substrate had been polished and chemically etched. The cap layer was further coated with a p-side electrode 44 in the form of a stripe having a width of 10 microns, and the aforementioned epitaxy layer was etched from the layer 23 to the layer 22 by using the electrode as the mask.

Moreover, cleavage was conducted so that the laser resonator might have a length of 300 microns.

The type was identical to that of the mesa-stripe type semiconductor laser.

The chip thus obtained was bonded to a submount and fixed in a cryostat which can cool from room temperature to 10° K. The mesa-stripe was irradiated transversely with the laser beam of a Kr ion laser having a band of 647 to 676 nanometers. The beam having that wavelength was absorbed by the semiconductor layers 20 and 21 to generate electrons 24 and positive holes 25 respectively in those layers. This behavior was shown in FIG. 4. With this state being left as it is, the electrons and the positive holes will not be separated but recombined in the GaAs layers 20 and 21 to emit light. By increasing this excited light, the ordinary laser oscillations will occur.

Figure 5:
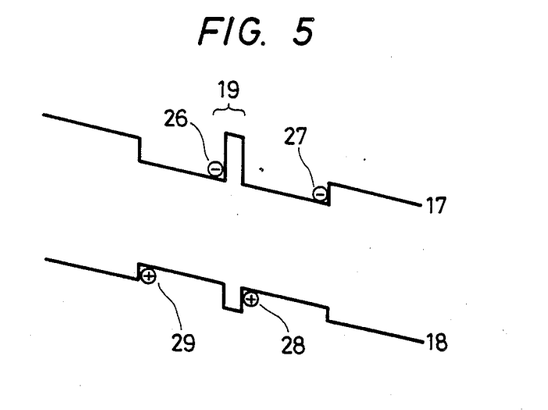

Now, the changes of the band gap in the case where an electric field is applied in the reverse direction to the p- and n-side electrodes in the optically excited state are shown in FIG. 5.

The electrons and the positive holes are pushed onto the respective ends of the GaAs layers 20 and 21. Since these layers have a thickness of 0.1 microns, the electrons and positive holes (26 and 29, and 27 and 28) present in the same layer cannot be recombined. However, the electrons 26 and the positive holes 28 become positioned so that there will result electron-hole pairs by the Coulomb force because only the barrier layer having a thickness of 20 Å is interposed inbetween.

Figure 6:
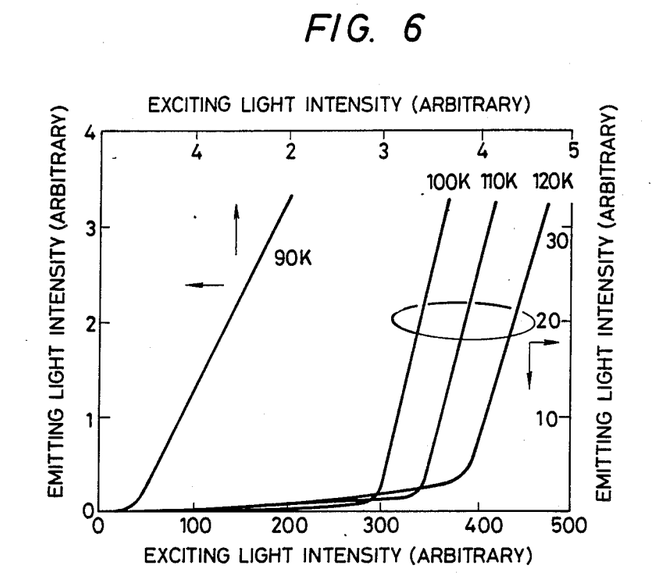
FIG. 6 is a graph depicting the temperature characteristics of the laser oscillations described with reference to FIG. 4.

The measurements of the changes of the output beam from the laser by using the temperature of the device as a parameter are depicted against the intensity of the pumping light in the state having the electric field applied in FIG. 6. As the device is cooled down to lower temperatures, the threshold current of the laser oscillations is decreased, and drastically drops in the case where the temperature becomes lower than 100° K., to raise the efficiency of light emission. At this temperature, the Bose condensation occurred so that the laser oscillations were observed from the state in which the phases of the excitons became coherent. The spectrum width of this light beam was one-tenth of that of the semiconductor laser beam of the prior art.

Figure 10:
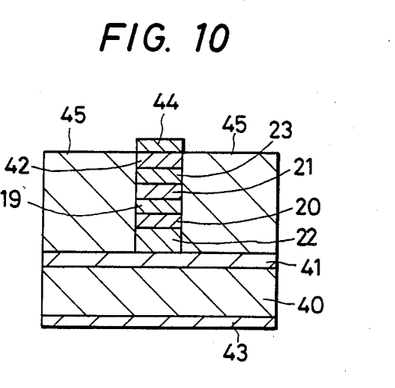

FIG. 10 shows the state in which both the sides of the semiconductor layered body for the light emission are buried in a semiconductor layer 45. This is an example in which a concept similar to the case of the ordinary BH (i.e., Buried Hetero-structure) type laser was adopted. The reference numerals appearing in FIG. 10 denotes the same parts as those of FIG. 9.

EXAMPLE 2

Figure 7:
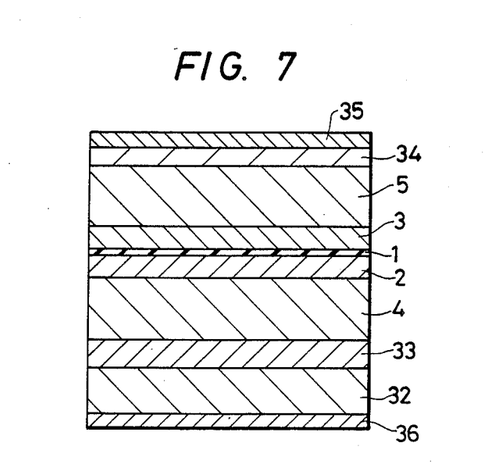
FIGS. 7, 9 and 10 are sections showing individual semiconductor optical devices of the present invention.

The semiconductor laser having the structure shown in FIG. 7 was fabricated by the MO-CVD (i.e., Metal-Organic Chemical-Vapor Deposition) method. After an n-type GaAs/Ga$_{0.7}$Al$_{0.3}$As super-lattice buffer layer 33 had been grown to have a thickness of 1 micron on an n-type GaAs substrate 32, there were subsequently grown an n-type Ga$_{0.7}$Al$_{0.3}$As cladding layer 4 of 2 microns, an undoped GaAs active layer 2 (which had a thickness of 0.1 microns), an undoped Al As barrier layer 1 (which had a thickness of 30 Å), an undoped GaAs active layer 3 (which had a thickness of 0.1 microns), a p-type Ga$_{0.7}$Al$_{0.3}$As cladding layer 5 (which had a thickness of 1.5 microns), and a p-type GaAs cap layer 34 (which had a thickness of 0.2 microns). The aforementioned super-lattice buffer layer 33 was sufficiently exemplified by the ordinary super-lattice layer.

By using a process similar to that of the ordinary semiconductor laser, p- and n-side electrodes 35 and 36 were formed, and the opposite face of the resonator was cleaved and bonded to the electrodes.

The energy band diagram in the case where a bias was applied in the forward direction and carriers were injected to the p-n junction of the semiconductor laser element thus obtained is shown in FIG. 2. The characteristics were examined by changing the injection current while the device was being cooled at a low temperature. The semiconductor laser obtained had an oscillatory threshold current of 1 microampere at 92° K.

EXAMPLE 3

Figure 8:
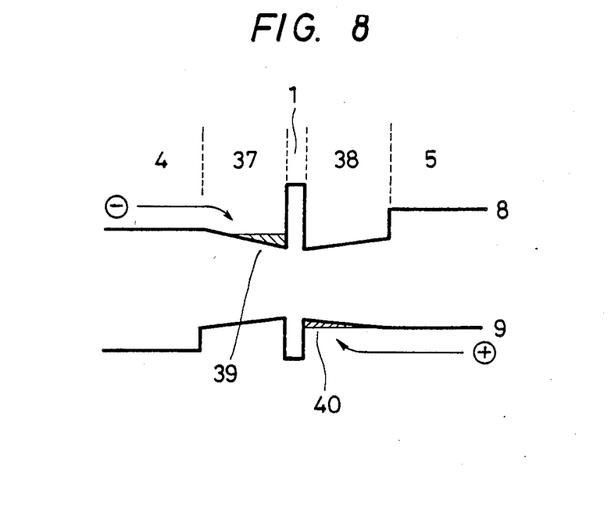
FIG. 8 is an energy band diagram of a semiconductor optical device in which the electrons and the positive holes are pushed toward the barrier.

In the semiconductor laser having been described in connection with the Example 2, the band gap of the laser active layers 2 and 3 present at both the sides of the insulating film 1 can be reduced at the barrier, as shown in FIG. 8, by changing the Al compositional ratio of the Ga$_{1-x}$Al$_x$As and the concentration of the impurity in the direction of the thickness of crystal. The carriers in both the conduction and valence bands are pushed to the barrier by the electric bias to increase the probability of generating the excitons. In FIG. 8, the bias is applied in the forward direction to the p-n junction.

EXAMPLE 4

In the semiconductor laser having been described in connection with the Example 2, the insulating film 1 was made of Ga$_x$In$_{1-x}$P$_y$As$_{1-y}$ (inclusive of x=0, y=0), and the laser active layers 2 and 3 at both the sides of the insulating film 1 were made of Ga$_m$In$_{1-m}$P$_x$As$_{1-x}$, thus fabricating the semiconductor optical device. This device had a threshold current of 1.5 microamperes.

INDUSTRIAL APPLICABILITY

In the optical device according to the present invention, the generation of a signal is conducted by the scheme having been subjected to the Bose condensation so that the information can be transmitted with a remarkably small number of photons. The superradiance of the excitons having conducted the Bose condensation has a spectrum width of one tenth as wide as that of the semiconductor laser of the prior art, and the threshold current of the laser oscillations is one-ten thousandth (1/10,000). Thus, the performance of the semiconductor laser is drastically improved. Because of the Bose condensation of the excitons through the thin film barrier, moreover, it is practically advantageous that the condensation takes place at a high temperature of 100° K. (although the temperature for establishing the ordinary super-conductive state is lower by about one order). The condensation of the excitons in the case without any barrier is not caused by a high-density excitation no matter how the temperature might be reduced. This is because the excitons become the electron-hole drops or molecules. These exciton molecules themselves experience the Bose condensation at a low temperature of several °K. Since the exciton molecules will dissociate into excitons in the course of their emissions and since the emissions of the two are different in wavelength, however, there has never been any report of the laser oscillations.

In summary, the present invention can provide a semiconductor optical element which is enabled to emit an optical beam having a narrow spectrum band by causing the electrons and the positive holes to recombine, in a condition which cause Bose degeneration of the excitons by controlling the thickness and the aplied electric field of the barrier layer, artificially. It is also possible to drop the threshold current of the device.

In short, the effect of the invention to provide a semiconductor device for emitting an optical beam coherent in wavelength and phase on the basis of the novel concept highly contributes to the industry.

What is claimed is:

1. A semiconductor optical device comprising:
a substrate;
semiconductor layers formed on said substrate including a first semiconductor layer which has a first forbidden band energy gap, and a second semiconductor layer which has a second forbidden band energy gap;
a third relatively thin layer being formed between said first and second semiconductor layers and having a third forbidden band energy gap which is larger than both of said first and second forbidden band energy gaps, wherein said third layer has a thickness which is sufficiently thin so that electrons and positive holes in said first and second semiconductor layers through said third layer form excitons as a result of having an overlapping of wave functions of the electrons and the positive holes; and
means for controlling probability of tunneling recombination of the electrons and the positive holes which form excitons through the third layer and including a pair of electrodes one of which being coupled to said first semiconductor layer and the other one of said pair of electrodes being coupled to said second semiconductor layer.

2. A semiconductor optical device as set forth in claim 1, characterized in that a probability T of the tunneling recombination of the electrons and positive holes, in which the thickness D (Å) and the height H (eV) of the barrier constructing said third layer is expressed by $T = \exp[-0.4 D\sqrt{H}]$, falls within a range of 0.6 to $1 \times 10^{-10}$ in the state having no voltage applied.

3. A semiconductor optical device as set forth in claim 1, or 2, characterized in that an overlap of wave functions of the electrons and the positive holes through said third layer is made larger than an overlap of the wave functions of the electrons and the positive holes within each one of said first and second semiconductor layers by making the thicknesses of said first and second semiconductor layers not smaller than 200 Å thereby resulting in pushing said electrons and said positive holes of said first and second semiconductor layers to the third layer by the respective composition of the crystal structure of said first and second semiconductor layers, of doped impurity in the crystal of said first and second semiconductor layers, or by a pseudopotential established by an external field.

4. A semiconductor optical device as set forth in claim 1, characterized in that said third layer is made of a semiconductor of a direct transition type.

5. A semiconductor optical device as set forth in claim 1, characterized in that said third layer has a thickness ranging from that of a monoatomic layer to 100 Å.

6. A semiconductor optical device as set forth in claim 1, characterized in that said third layer has a thickness not greater than 100 Å.

7. A semiconductor optical device as set forth in claim 1, characterized by having means for applying an electric field in a direction normal to said third layer to said first and second semiconductor layers opposed to each other through said third layer to collect said electrons at an interface between a first main surface of said third layer and one of said first and second semiconductor layers and said positive holes at an interface between a second main surface of said third layer and the other of said first and second semiconductor layers.

8. A semiconductor optical device as set forth in claim 1, characterized in that the composition and/or impurity density of one or both of said first and second semiconductor layers are made nonuniform in the direction of the thickness of said third layer to collect said electrons and said positive holes in the vicinity of said third layer.

9. A semiconductor optical device as set forth in claim 1, characterized in that a layered structure constructed of at least said third layer and said first and second semiconductor layers is sandwiched between third and fourth semiconductor layers which have a larger forbidden band energy gap than said first and second semiconductor layers and which have different types of conductivity.

10. A semiconductor optical device as set forth in claim 1, characterized in that said third layer is made of $Ga_{1-x}Al_xAs$, said first semiconductor layer is made of $Ga_{1-y}Al_yAs$, and said second semiconductor layer is made of $Ga_{1-z}Al_zAs$, wherein: $x > y$ and $z$; $1 \geq x > 0.1$; and $0.4 > y$ and $z \geq 0$.

11. A semiconductor optical device as set forth in claim 1, characterized in that said third layer is made of $Ga_xIn_{1-x}P_yAs_{1-y}$ (which holds even for $x=0$ and $y=0$), and said first and second semiconductor layers are made of $Ga_mIn_{1-m}P_xAs_{1-x}$.

12. A semiconductor optical device comprising:
a first semiconductor layer having a first narrow forbidden energy band,
a second semiconductor layer having a second narrow forbidden energy band,
a third layer being formed between the first and the second semiconductor layer and having a third forbidden energy band which is wider than said first and said second narrow energy band so as to provide an alignment of electrons in one of said first and second semiconductor layers and holes in the other of said first and second semiconductor layers to effect Bose condensation, and
means for controlling probability of recombination of said electrons and holes.

13. A semiconductor optical device according to claim 12, characterized in that an overlap of wave functions of the electrons and the positive holes through said third layer is made larger than an overlap of the wave functions of the electrons and the positive holes within each one of said first and second semiconductor layers by making the thicknesses of said first and second semiconductor layers not smaller than 200 Å thereby resulting in pushing said electrons and said positive holes of said first and second semiconductor layers to the third layer, the degree of movement toward the third layer being controlled by the respective composition of the crystal structure of said first and second semiconductor layers, of doped impurity distribution in the crystal of said first and second semiconductor layers, or by a pseudo-potential established by an external field.

14. A semiconductor optical device according to claim 13, characterized in that said third layer is made of a semiconductor of a direct transition type.

15. A semiconductor optical device according to claim 14, characterized in that said third layer has a thickness ranging from that of a monoatomic layer to 100 Å.

16. A semiconductor optical device according to claim 13, characterized in that said third layer has a thickness ranging from that of a monoatomic layer to 100 Å.

17. A semiconductor optical device according to claim 14, characterized in that said third layer has a thickness not larger than 100 Å.

18. A semiconductor optical device according to claim 13, characterized in that said third layer has a thickness not larger than 100 Å.

19. A semiconductor optical device according to claim 12, wherein said first and second semiconductor layers are comprised of material with a molecular composition crystal structure of component elements therein which are nonuniformly ratioed and/or impurity doping concentration which is nonuniformly distributed in the direction corresponding to the thickness of said crystal structure.

20. A semiconductor optical device according to claim 12, further comprising:
a semiconductor substrate of a first conductivity type, wherein there is formed thereon on a first principal surface thereof, as a vertically stacked arrangement, a mesa-stripe type semiconductor laser, in the following order:
a first cladding layer,
an undoped first GaAs layer corresponding to said first semiconductor layer,
a barrier layer corresponding to said third layer,
an undoped second GaAs layer corresponding to said second semiconductor layer,
a second cladding layer,
a semiconductor cap layer of a second complementary conductivity type, and
wherein there is further included a pair of electrodes, one being formed on a second principal surface of said semiconductor substrate and the other one being formed on said semiconductor cap layer which is an upper surface of said vertically stacked arrangement.

21. A semiconductor optical device according to claim 20, wherein said first and second cladding layers are semiconductor layers which have a wider forbidden band energy than said first and second GaAs layers.

22. A semiconductor optical device according to claim 21, wherein said barrier layer is a $Ga_{1-x}Al_xAs$ semiconductor layer, said first cladding layer is a $Ga_{1-y}Al_yAs$ semiconductor layer, and said second cladding layer is a $Ga_{1-z}Al_zAs$ semiconductor layer, wherein $x > y$ and $z$, $1 \geq x > 0.1$, $y < 0.4$, and $z \geq 0$.

23. A semiconductor optical device according to claim 22, wherein said $Ga_{1-x}Al_xAs$ semiconductor barrier layer, said $Ga_{1-y}Al_yAs$ and said $Ga_{1-z}Al_zAs$ semiconductor layers are undoped semiconductor layers.

24. A semiconductor optical device according to claim 23, wherein said barrier layer has a thickness of about 30 Å and said first and second undoped GaAs layer have a thickness of about 0.1 μm.

25. A semiconductor optical device according to claim 24, wherein said first and second semiconductor cladding layers have a thickness of about 2 μm.

26. A semiconductor optical device according to claim 25, wherein said semiconductor cap layer is a p-type GaAs layer having a thickness less than said cladding layers and greater than said first and second undoped GaAs layers, and said semiconductor substrate is an n-type GaAs substrate.

27. A semiconductor optical device according to claim 26, wherein said cap layer thickness is about 0.2 μm.

28. A semiconductor optical device according to claim 27, wherein there is further included a buffer layer formed on said first principal surface of said semiconductor substrate and which corresponds to a semiconductor layer disposed between said semiconductor substrate and the lowermost layer of the mesa which is said first cladding layer.

29. A semiconductor optical device according to claim 28, wherein said buffer layer is an n-type GaAs layer having a thickness of about 0.5 μm.

30. A semiconductor optical device according to claim 20, wherein there is further included a buffer layer formed on said first principal surface of said semiconductor substrate and which corresponds to a semiconductor layer disposed between said semiconductor substrate and the lowermost layer of the mesa which is said first cladding layer.

31. A semiconductor optical device according to claim 30, wherein said first and second cladding layers are semiconductor layers which have a wider forbidden band energy than said first and second GaAs layers.

32. A semiconductor optical device according to claim 31, wherein said barrier layer is a $Ga_{1-x}Al_xAs$ semiconductor layer, said first cladding layer is a $Ga_{1-y}Al_yAs$ semiconductor layer, and said second cladding layer is a $Ga_{1-z}Al_zAs$ semiconductor layer, wherein $x > y$ and $z$, $1 \geq x > 0.1$, $y < 0.4$, and $z \geq 0$.

33. A semiconductor optical device according to claim 30, wherein said barrier layer is a $Ga_{1-x}Al_xAs$ semiconductor layer, said first cladding layer is a $Ga_{1-y}Al_yAs$ semiconductor layer, and said second cladding layer is a $Ga_{1-z}Al_zAs$ semiconductor layer, wherein $x > y$ and $z$, $1 \geq x > 0.1$, $y < 0.4$, and $z \geq 0$.

34. A semiconductor optical device according to claim 33, wherein said $Ga_{1-x}Al_xAs$ semiconductor barrier layer, said $Ga_{1-y}Al_yAs$ and said $Ga_{1-z}Al_zAs$ semiconductor layers are undoped semiconductor layers.

35. A semiconductor optical device according to claim 29, wherein said buffer layer and said vertically stacked arrangement are epitaxial layers.

36. A semiconductor optical device according to claim 29, wherein said mesa vertically stacked layer arrangement is embedded in a further semiconductor layer having an upper surface which is planar with the upper surface of said mesa layer arrangement, whereby there is effected a buried heterostructure type semiconductor laser.

37. A semiconductor optical device according to claim 12, further comprising:
a semiconductor substrate of a first conductivity type, wherein there is formed on a first principal surface thereof, as a vertically stacked arrangement, in the following order:

a buffer layer of said first conductivity type,
a first cladding semiconductor layer of said first conductivity type,
a first active semiconductor layer corresponding to said first semiconductor layer,
a thin barrier layer corresponding to said third layer,
a second active semiconductor layer corresponding to said second semiconductor layer,
a second cladding semiconductor layer of a second complementary conductivity type,
a semiconductor cap layer of said second conductivity type, and
wherein there is further included a pair of electrodes, one being formed on a second principal surface of said semiconductor substrate and the other one being formed on said semiconductor cap layer, thereby effecting a semiconductor laser.

38. A semiconductor optical device according to claim 37, wherein said thin barrier layer has a thickness of less than 100 Å, said first and second active semiconductor layers being undoped GaAs active layers, said first and second cladding semiconductor layers are an n-type $Ga_{0.7}Al_{0.3}As$ layer and a p-type $Ga_{0.7}Al_{0.3}As$ layer, respectively, said buffer layer is an n-type GaAs/$Ga_{0.7}Al_{0.3}As$ super-lattice buffer layer, said substrate an n-type GaAs semiconductor substrate and said cap layer is a p-type GaAs semiconductor layer.

39. A semiconductor optical device according to claim 38, wherein said thin barrier layer has a thickness of about 30 Å and is an undoped AlAs layer, said first and second active layers have a thickness of about 0.1 μm, said first cladding layer has a thickness of about 2 μm, said second cladding layer has a thickness of about 1.5 μm, said cap layer has a thickness of about 0.2 μm, and said buffer layer has a thickness of about 1 μm.

40. A semiconductor optical device according to claim 37, wherein said thin barrier layer is a $Ga_xIn_{1-x}P_yAs_{1-y}$ layer, which is inclusive of x=0 and y=0, and wherein said first and second active semiconductor layers are $Ga_mIn_{1-m}P_xAs_{1-x}$ layers.

41. A semiconductor optical device according to claim 40, wherein said thin barrier layer has a thickness of about 30 Å and is an undoped AlAs layer, said first and second active layers have a thickness of about 0.1 μm, said first cladding layer has a thickness of about 2 μm, said second cladding layer has a thickness of about 1.5 μm, said cap layer has a thickness of about 0.2 μm, and said buffer layer has a thickness of about 1 μm.

42. A semiconductor optical device according to claim 37, wherein said first and second semiconductor layers are comprised of material with a molecular composition crystal structure of component elements therein which are nonuniformly ratioed and/or impurity doping concentration which is nonuniformly distributed in the direction corresponding to the thickness of said third layer.

43. A semiconductor optical device comprising:
a stacked arrangement of semiconductor layers; and
means for controlling probability of tunnel recombination of electrons and holes existing in different semiconductor layers of said stacked arrangement, the electrons and the holes form excitons subjected to Bose condensation so that the emissions obtained from the excitons have a high density and a coherent phase.

44. A semiconductor optical device according to claim 43, wherein said electrons and holes which form respective excitons correspond to first and second active semiconductor layers, having a first and a second forbidden energy band, respectively, of said stacked arrangement and which have interposed therebetween a thin barrier layer having a third forbidden energy band which is greater than said first and said second forbidden energy band.

45. A semiconductor optical device according to claim 44, wherein said first and second semiconductor active layers, together with said interposed thin barrier layer, are interposed between first surfaces of third and fourth cladding semiconductor layers, which have a greater forbidden energy band than that of said first and second active layers.

46. A semiconductor optical device according to claim 45, further including a cap semiconductor layer of one conductivity type formed on a second opposing surface of said second cladding layer, a semiconductor substrate and a semiconductor buffer layer, the latter interposed between a first principal surface of said semiconductor substrate and a second opposing surface of said first cladding layer, wherein said cap semiconductor layer and said semiconductor substrate have formed thereon, on opposing surfaces, electrodes, said semiconductor substrate and said buffer layer being of a second complementary conductivity type.

47. A semiconductor optical device according to claim 46, wherein said barrier layer is a $Ga_{1-x}Al_xAs$ semiconductor layer, said first cladding layer is a $Ga_{1-y}Al_yAs$ semiconductor layer, and said second cladding layer is a $Ga_{1-z}Al_zAs$ semiconductor layer, wherein x>y and z, $1\geq x>0.1$, y<0.4, and $z\geq 0$.

48. A semiconductor optical device according to claim 47, wherein said $Ga_{1-x}Al_xAs$ semiconductor barrier layer, said $Ga_{1-y}Al_yAs$ and said $Ga_{1-z}Al_zAs$ semiconductor layers are undoped semiconductor layers, said barrier layer has a thickness of about 30 Å, said first and second undoped GaAs layer have a thickness of about 0.1 μm, said first and second semiconductor cladding layers have a thickness of about 2 μm, said semiconductor cap layer is a p-type GaAs layer having a thickness less than said cladding layers and greater than said first and second undoped GaAs layers, said semiconductor substrate is an n-type GaAs substrate, and wherein said buffer layer is an n-type GaAs layer having a thickness of about 0.5 μm.

49. A semiconductor optical device according to claim 43, wherein said thin barrier layer has a thickness of less than 100 Å, said first and second active semiconductor layers being undoped GaAs active layers, said first and second cladding semiconductor layers are an n-type $Ga_{0.7}Al_{0.3}As$ layer and a p-type $Ga_{0.7}Al_{0.3}As$ layer, respectively, said buffer layer is an n-type GaAs/$Ga_{0.7}Al_{0.3}As$ super-lattice buffer layer, said substrate an n-type GaAs semiconductor substrate and said cap layer is a p-type GaAs semiconductor layer.

50. A semiconductor optical device according to claim 49, wherein said thin barrier layer has a thickness of about 30 Å and is an undoped AlAs layer, said first and second active layers have a thickness of about 0.1 μm, said first cladding layer has a thickness of about 2 μm, said second cladding layer has a thickness of about 1.5 μm, said cap layer has a thickness of about 0.2 μm, and said buffer layer has a thickness of about 1 μm.

51. A semiconductor optical device according to claim 45, wherein said thin barrier layer is a $Ga_xIn_{1-x}P_yAs_{1-y}$ layer, which is inclusive of x=0 and y=0, and wherein said first and second active semiconductor layers are $Ga_mIn_{1-m}P_xAs_{1-x}$ layers.

* * * * *